United States Patent [19]
Lindblad et al.

[11] Patent Number: 5,133,118
[45] Date of Patent: Jul. 28, 1992

[54] SURFACE MOUNTED COMPONENTS ON FLEX CIRCUITS

[75] Inventors: Scott A. Lindblad, Savage; Gary E. Meinke, Northfield, both of Minn.

[73] Assignee: Sheldahl, Inc., Northfield, Minn.

[21] Appl. No.: 740,931

[22] Filed: Aug. 6, 1991

[51] Int. Cl.$^5$ .............................................. H05K 3/34
[52] U.S. Cl. ...................................... 29/840; 29/827; 29/564; 29/564.1; 174/52.4; 437/207
[58] Field of Search ................ 29/827, 840, 830, 846, 29/564.1, 564; 174/52.4; 437/207

[56] References Cited

U.S. PATENT DOCUMENTS

| | | | |
|---|---|---|---|
| 3,317,287 | 12/1963 | Caracciolo . | |
| 3,550,766 | 12/1970 | Nixen et al. . | |
| 3,689,991 | 9/1972 | Aird | 437/207 |
| 3,691,629 | 9/1972 | Schierz | 437/207 |
| 3,838,984 | 10/1974 | Crane et al. . | |
| 4,214,364 | 7/1980 | St. Louis et al. | 29/827 |
| 4,312,926 | 1/1982 | Burns . | |
| 4,466,183 | 8/1984 | Burns | 29/827 |
| 4,635,092 | 1/1987 | Yerman et al. . | |
| 4,667,403 | 5/1987 | Edinger et al. | 29/564.1 X |
| 4,721,992 | 1/1988 | Emamjomeh et al. . | |
| 4,763,409 | 8/1988 | Takekawa et al. | 29/827 |
| 4,778,564 | 10/1988 | Emamjomeh et al. . | |
| 4,806,409 | 2/1989 | Walter et al. | 29/827 X |
| 4,927,491 | 5/1990 | Masaki | 29/827 X |
| 4,944,850 | 7/1990 | Dion | 29/827 X |
| 4,995,941 | 2/1991 | Nelson et al. | 29/827 X |
| 4,997,517 | 3/1991 | Parthasarathi | 29/827 X |
| 5,067,229 | 11/1991 | Nakamura | 29/827 X |
| 5,069,706 | 11/1991 | Ueda et al. | 437/707 X |

Primary Examiner—Carl J. Arbes
Attorney, Agent, or Firm—Haugen and Nikolai

[57] ABSTRACT

A process for preparation of electronic packages including printed circuits wherein the circuit portions of the package are formed from a web including a plurality of circuits maintained in an array during processing. Holding tabs are provided to maintain the integrity of the array, with the holding tabs being in the form of releasable retention tabs for temporarily holding the array together and accommodating multiple-up processing of the electronic package. For certain portions of the process, the web is separated into multiple-up circuit packages wherein the circuits are disposed within the central portion of the panel, and with the lateral edges and ends collectively defining an annular circuit-free zone. Multiple fiducial points are located within or around the circuit patterns, thereby eliminating or reducing the requirement for circuit-specific tooling and permitting multiple-up handling of the circuits in each array.

5 Claims, 2 Drawing Sheets

Fig.-1

```
PREPARE LAYOUT OF CIRCUIT ARRAY WITH
FIDUCIAL POINTS.
        │
FABRICATE ARRAY OF FLEXIBLE CIRCUITS,
EACH INCLUDING COMPONENT MOUNTING PADS,
AND FORMING INTERMITTENT CUTLINES TO
PARTIALLY SEVER INDIVIDUAL CIRCUITS
WITHIN ARRAY.
        │
TEST CIRCUITS.
        │
ORIENT ARRAY UPON PALLET TO FORM
ASSEMBLY FOR PLACEMENT ON VACUUM BED.
        │
CHECK FOR FIDUCIAL POINTS AND INDIVIDUAL
CIRCUIT PRESENCE IN ARRAY.
        │
APPLY SOLDER PASTE ONTO CIRCUITS AT
MOUNTING PAD LOCATIONS.
        │
PLACE ASSEMBLY WITH CIRCUIT ARRAY BENEATH
AUTOMATIC COMPONENT PLACEMENT MECHANISM.
        │
APPLY ACTIVE AND PASSIVE COMPONENTS IN
PLACE ON SURFACE OF INDIVIDUAL CIRCUITS.
        │
PLACE ASSEMBLY WITH ARRAY IN THERMAL
CHAMBER FOR REFLOW OF SOLDER PASTE.
        │
[WASH SURFACE OF CIRCUITS IN ARRAY TO
 REMOVE FLUX.]
        │
TEST FINISHED CIRCUITS WHILE IN ASSEMBLY.
        │
REMOVE CIRCUIT ARRAY FROM PALLET.
        │
SEPARATE INDIVIDUAL FINISHED CIRCUITS
FROM ARRAY.
```

(Steps from "ORIENT ARRAY UPON PALLET..." through "TEST FINISHED CIRCUITS WHILE IN ASSEMBLY." are grouped as: CONVEYOR OPERATION)

SURFACE MOUNTED COMPONENTS ON FLEX CIRCUITS

BACKGROUND OF THE INVENTION

The present invention relates generally to the preparation of flexible printed circuits, and more particularly to the preparation of electronic packages including printed circuits formed upon a flexible substrate wherein a plurality of circuits are maintained in an array during processing utilizing holding tabs for array integrity. The holding tabs form a releasable retention means as a device for temporarily holding an array together for multiple-up processing of the electronic package. The process of the present invention provides a handling advantage in the processing of flexible printed circuits to form electronic packages through the utilization of multiple-up circuit panels while maintaining the work-in-process in a form wherein certain phases of the overall processing operation may be accomplished on a roll-to-roll basis, with other later phases being accomplished on a multiple-circuit panel basis. The panels are formed from severed segments of an elongated web, and include a plurality of individual circuits surrounded by lateral and end portions upon which the web driving bores as well as fiducial targets or features are located.

The arrangement of the present invention provides a significant production advantage in that it eliminates or reduces requirements for a number of circuit-specific tooling devices or objects which are related to individual or specific circuit patterns, thus expediting the assembly and testing operations and while reducing the overall production and processing costs. In the conventional processing of printed circuits, it has been considered normal procedure to utilize material handling tooling which is circuit or part-number specific, with such tooling being utilized during a number of the processing operations including assembly and testing. In accordance with the present invention, however, the flexible printed circuits are processed or fabricated while being held in a multiple-up web or panel form utilizing holding tabs created by intermittent cut-lines delineating the periphery of individual circuits in the web. Accordingly, the process of the present invention makes it possible to expeditiously prepare printed circuits on the basis of utilizing multiple-up webs or panels while at the same time preserving certain processing operations for undertaking on a roll-to-roll basis.

The process includes the fabrication of a circuit array utilizing fiducial points disposed outside of or within the individual circuits. Each of the individual circuits in the array includes the presence of exposed component mounting pads for ultimately receiving and retaining components thereon. Both active and passive components may be utilized in accordance with the technique of the present invention, and the sequence of operations renders it possible to preserve such components for placement only upon pre-tested good circuits.

The process of the present invention also includes the step of forming intermittent cut-lines to partially sever individual circuits within the array while leaving holding tabs to preserve adequate integrity of the array within the web. In other words, the cut-lines are designed to releasably retain individual circuits in place within the array until processing has been more completely carried out or completed. The holding tabs are arranged in such a fashion so as to make it possible to separate individual finished circuits from the array at a later point either by hand-severing or through means of a mechanical separator.

SUMMARY OF THE INVENTION

The process of the present invention includes the formation of a circuit array employing holding tabs as a means of bridging and otherwise retaining individual circuits together, and further utilizing fiducial points and edge drive bores disposed outside of the circuit array. In other words, a panel of circuits is provided with the center portion being occupied by the fabricated array of circuits and with the outer annular zone or portion being utilized for the formation or location of fiducial points and drive bores. The holding tabs are preferably formed by notched dies, with the notches being utilized to form the tabs to releasably retain the individual circuits in place within the array for further processing. The process of the present invention further employs a testing operation which is undertaken on each individual circuit following its formation, and prior to its being arranged to receive individual active and/or passive components thereon. Therefore, following preparation of the individual circuits, and the formation of the holding tabs, the individual circuits undergoing tests comprise a provisional array. Following the testing operation, individual defective circuits are removed from the provisional array, thereby forming the working array consisting entirely of tested and acceptable circuits which will thereafter receive active and/or passive components thereon through surface mounting techniques.

Following removal of those circuits which do not qualify in the testing operation, the working array is then mounted and oriented upon a pallet or other support to form an assembly for adjustable placement on a retention bed, such as a vacuum bed or the like. Thereafter, this array is placed within a detection zone for determining the presence and/or absence of circuits within the array, after which solder paste is applied to mounting pad locations on the individual circuits. The assembly including the working array is then placed beneath an automated component placement mechanism, and individual active and passive components are lodged in place. Thereafter, the assembly is placed in a thermal chamber, such as an infrared oven or the like to initiate reflow of the solder paste. Thereafter the circuits are washed to remove excess flux and tested while remaining in the assembly. Thereafter the individual circuits comprising the working array are removed from the pallet to permit subsequent separation of the holding tabs and ultimate removal of individual circuits from the array.

In addition to the advantages available from the processing operations of the present invention, additional advantages have been found to be present in the product including the reduction or elimination of solder joint and adhesive fatigue, and further reduction in the formation of mechanical micro-cracks in the circuits coupled to the electronic components.

Therefore, it is a primary object of the present invention to provide an improved process for the preparation of surface-mounted components on flexible circuit substrates, wherein the process reduces the requirement of circuit-specific tooling, while enhancing the production rates and yields available.

It is another object of the present invention to provide an improved process for the preparation of flexible circuits, including particularly circuits with surface-mounted components, wherein the process includes the utilization of a notched die to form intermittent cut-lines and thus create holding tabs situated about the periphery of individual circuits held in an array.

It is a further object of the present invention to provide an improved process for the fabrication of flexible circuits having surface-mounted components thereon, wherein the process includes testing operations which are undertaken at points in the process so as to preserve the integrity of the circuits within the working assembly, and to preserve and reserve the utilization of components only for acceptable circuits.

It is yet a further object of the present invention to provide an improved technique for the preparation of flexible electrical circuits for the formation of flexible electronic packages which have improved properties, including the elimination and/or reduction of areas of solder joint fatigue, adhesive fatigue, and also a reduction in the formation of mechanical micro-cracks in the electronic components.

Other and further objects of the present invention will become apparent to those skilled in the art upon a study of the following specification, appended claims, and accompanying drawing.

IN THE DRAWINGS

FIG. 1 is a flow chart setting forth a typical sequence of operations undertaken while carrying out the various steps involved in the process of the present invention; and FIG. 2 is a top plan view of a typical layout of a circuit array prepared in accordance with the process of the present invention.

DESCRIPTION OF THE PREFERRED EMBODIMENT

Figure 2:
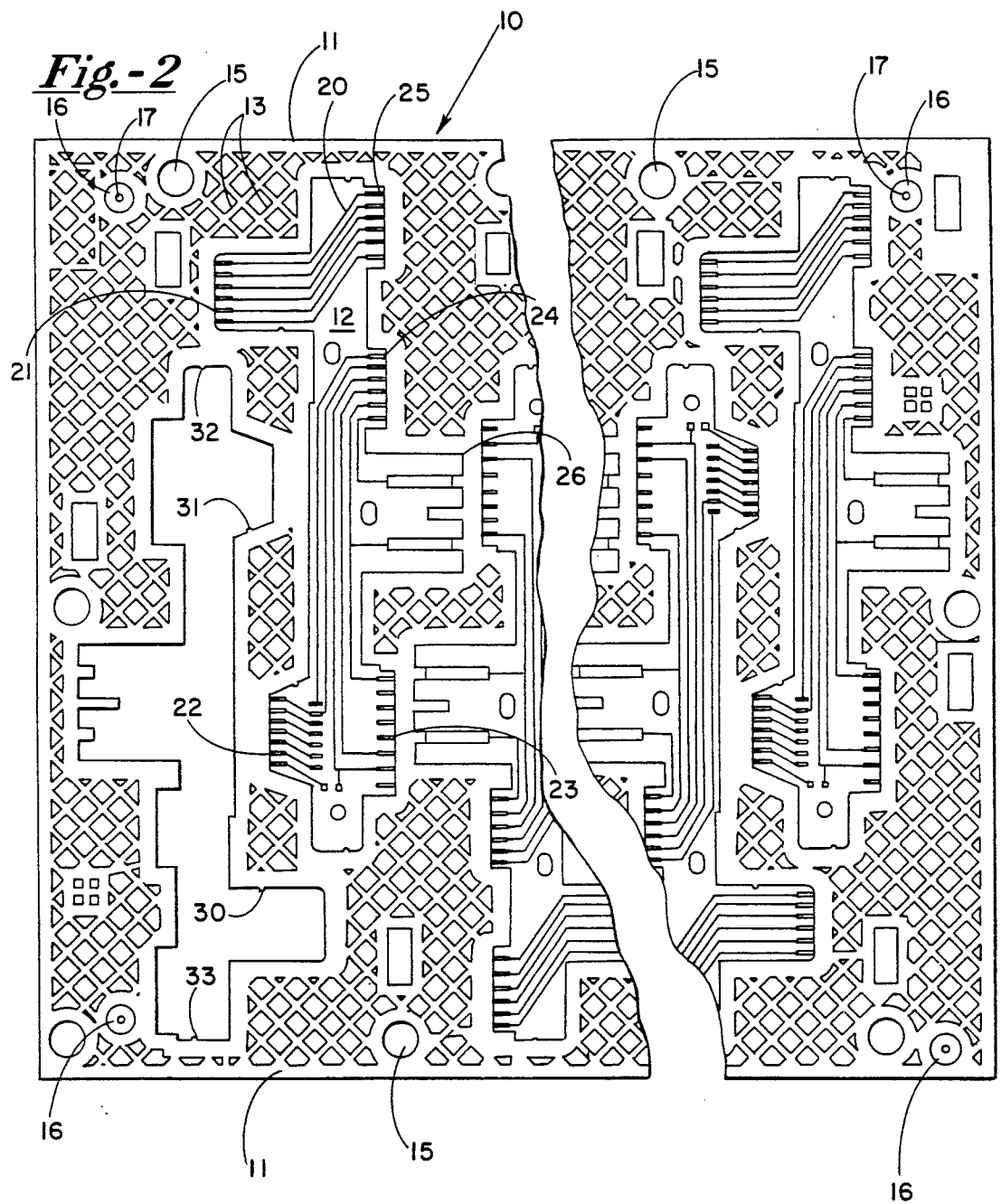

With attention being directed to the flow chart, it will be observed that the process of the present invention involves a series of successive steps or operations. In order to disclose an entire typical process, the following description is provided as exemplary.

1. Prepare Layout of Circuit Array

This step in the process is initiated through the selection and utilization of a laminate comprising a conductive metal such as copper and an insulative substrate such as stress-oriented polyimide film. Such laminates are, of course, commercially available, with one such source being Sheldahl, Inc. of Northfield, Minn. Typically, the copper will have a thickness ranging from between about one-half mil and two mils, with 1.4 mil (one oz./ft.$^2$) copper being typical for a wide variety of circuits, and also generally preferred. Bilaterally stress-oriented polyethylene terephthalate is a possible substrate material, it being understood that others such as polyimide(amide) film material may also be found suitable as well. One commercially available polyimide(amide) film is sold under the trademark "Kapton" from E. I. DuPont de Nemours Corp. of Wilmington, Del. While copper is indicated as being the preferred metallic conductor, other metallic conductors, such as aluminum or copper-aluminum laminated metal may be suitably employed as well. The circuit layout is preferably arranged while the copper-substrate laminate is in an elongated web form. This permits certain of the operations, including resist coating, exposure to imaging, as well as etching, rinsing, and possibly further operations to be undertaken on a roll-to-roll basis.

A layout of the circuit array is initially prepared utilizing a screen printed or photosensitive resist material on the copper layer of the laminate, with the circuit array occupying the center portion or central field of the laminate structure, and with an annular area or outer zone being provided entirely outside of the area of the array. Photosensitive resists are, of course, widely commercially available, with resists including both negative and positive imaging resists, depending upon the nature of the photoimaging and etching operation to be undertaken.

In the preparation of the layout of an array of individual circuits, those areas lying within the annular outer zone of the actual circuits in the array will be provided with precisely located drive bores and fiducial points along with any other desired identifying indicia. The fiducial points are utilized to provide a plurality of fixed reference points for the circuit patterns, with the plurality of fixed reference points cooperating to define an overall fixed position for the circuits undergoing processing while being held within the array.

The web of material is next subjected to an etching operation wherein a provisional array of flexible conductive circuits is formed within the defined circuit pattern portion of the laminate structure. Etching operations which may be utilized for the formation of such an array of flexible conductive circuits are well known in the art, with the active ingredients of such working etching solutions being widely commercially available. In addition to forming the individual provisional array, the plural fiducial points ar also provided. With the plural fiducial points cooperating as a group to provide the desired fixed reference for the circuit patterns.

In the fabrication of the flexible circuits, each individual circuit will include at least two component mounting pads. The mounting pads are designed to receive and secure, through a solder application and subsequent reflow operation, at least one electrical or electronic component in electrically and mechanically fixed relationship with the circuit. The mounting pads are, of course, designed to receive either active or passive components, with the arrangement of such mounting pads and their utilization in receiving a component thereon being well known in the art.

2. Formation of Intermittent Cut-Lines

The array of circuits is then subjected to a die cutting operation where notched dies are employed to form intermittent cut-lines to identify, delineate, and partially sever individual circuits within the array and to form holding tabs between mutually adjacent circuits and also between the circuits and the outer annular zone. The location of the holding tabs is designed to provide minimal risk of exposure of the circuits to degradation or misregistration and to reduce if not eliminate risk of damage to the conductive lines in the circuit.

In order to reduce and/or eliminate risk of damage to the circuit, the non-cut or tab zones are preferably placed where the circuit is relatively stationary when in use. In other words, it is preferable to avoid tab placement in zones where flexure is likely to occur in the finished product. Also, it is desirable to avoid placement of holding tabs in zones closely adjacent to contact pads.

3. Initial Testing Operation

In order to improve the processing yield for the finished product, both qualitatively and quantitatively, an initial circuit testing operation is undertaken so as to identify completed circuits which may be defective. Any defective circuits present in the array are preferably removed from and otherwise eliminated from the group forming the array. Alternatively, defective circuits can be marked with an appropriate identifying indicia and permitted to remain in the array, while those circuits satisfying the test parameters are permitted to remain for further processing. By placing the initial test operation at this early point in the process, subsequent placement of components, both active and passive, may be controlled so that components are not delivered to zones which are not occupied by acceptable circuits, thus reducing the overall requirement for these components.

4. Positioning of Array Upon Pallet

Upon the removal of defective circuits from the provisional array, the remaining circuits are utilized to form the working array. The working array is severed or otherwise removed from the elongated web, and thereafter is mounted upon the surface of a pallet so as to form a working assembly. This working assembly is subsequently placed upon a work retention surface such as a vacuum bed conveyor. Thereafter, the assembly is ready for the next step in the operation.

In order to determine appropriate placement of the working assembly on the vacuum bed, and to determine which areas are to receive solder paste and components, means are provided to check for the presence and location of fiducial points as well as the presence or absence of individual circuits in the array. For example, the presence and location of fiducial points provides a fixed reference for circuits present in the array, while the location of specific circuits in the array provides a determination for the need to apply solder as well as components to the individual circuits. These determinations are conveniently undertaken with optical equipment, with such optical equipment being commercially available.

The retention means, preferably a vacuum bed, is arranged beneath a portion of a perforated endless conveyor belt, with the placement of the working assembly thereby being maintained in known register throughout each of the steps in the process where conveyor operation is undertaken.

5. Station for Application of Solder Paste

Conventional solder paste is placed onto individual circuits at each of the mounting pad locations, and also at other locations where the presence of a film of solder is indicated. The fusible solder paste is a typical example of a conductive thermally setting paste, it being understood that other such pastes may be utilized for this operation. This operation is preferably and may be conveniently undertaken while the working assembly is at dwell under a stencil. Application techniques for placement of solder paste onto circuits at known locations are well known in the art.

6. Surface Mounting of Components

The working assembly is placed in the operation zone of an automatic component placement mechanism such as an elevated or superimposed rotary turret for achieving appropriate component placement. Rotary component placement turrets are commercially available, and include means for adjustably positioning the components in place, with appropriate correction and adjustment being made while the working array is stationary. Such correction is within the capability of commercially available component placement turrets. The fiducial points are likewise employed to achieve appropriate registration of the working array within the system.

7. Thermal Treatment for Reflow

Following placement of active and/or passive components on the surface of the circuits, the working array is placed within the confines of an infrared oven for reflow of the conductive thermally setting paste, such as solder paste. The reflow operation is undertaken on a conventional basis, with such systems and processes being known in the art. Following reflow, the circuits may be washed in order to remove excess material such as flux. This washing operation is optional, depending upon circuit design and the type of conductive thermally setting paste utilized. When solder paste is utilized for this application, then, washing becomes a more desirable step in the overall processing operation.

8. Final Testing

In order to provide for delivery of completed flexible electronic packages having performance characteristics within design parameters, each of the finished circuits is tested while remaining in the working assembly. Test operations are, of course, specific to individual circuits, and the techniques and equipment employed are known to those skilled in the art.

9. Circuit Separation, Breaking of Individual Holding Tabs

Following testing, the working array is separated, with the individual finished circuits being removed from the pallet. Thereafter, individual finished circuits may be separated from the array by any convenient technique, such as by hand separation, or by separation techniques utilizing vacuum or other gripping devices.

10. Description or Specific Array Arrangements

Attention is now directed to FIG. 2 of the drawings wherein a typical circuit array is shown. In the arrangement of FIG. 2, a circuit array generally designated 10 includes an outer annular zone 11 into which a plurality of defined circuit patterns such as circuit patterns 12—12 are arranged and disposed. These circuit patterns 12—12 each have their own individual conductive lead patterns arranged thereon, with the conductive lead patterns being arranged, of course, on a flexible insulating substrate.

The outer annular zone 11 preferably contains a number of stiffener lines such as shown at 13——, which assist in the overall handling of the system, and match the flexibility (and/or rigidity) of the outer annular zones 11 with that of the circuits 12—12.

In order to provide a means for transmitting motion between a drive and the circuit array 10, a plurality of drive bores such as shown at 15—15 are provided, with these drive bores being located in that portion of the array located outside of the defined circuit patterns. Also located outside of the defined circuit pattern and in the outer annular zone are a plurality of fiducial points 16—16, each fiducial point having a central target spot 17 disposed concentrically therewithin. These fiducial points, as indicated, are arranged in an area to provide a fixed reference for the circuit patterns which comprise the array.

Each of the individual flexible conductive circuits 12—12 comprising the array includes a number of defined conductive lines forming the circuit pattern such as illustrated at 20. Additionally, contact or connector pads are provided as at 21—21 in order to couple the circuit 12 to a suitable connector device. Additionally, connector areas are shown at 23, 24 and 25. Additional connector points are illustrated at 26. A mounting pad 22 is arranged on the surface of the circuit 12 to receive surface-mounted components in electrically and mechanically bonded relationship with the circuit 12.

Each of the individual flexible circuits 12—12 in the array is provided with a cut-pattern about its periphery to create holding tabs extending between mutually adjacent individual circuits and the outside annular portion. These tabs are illustrated, for simplicity, at 30, 31, 32, and 33 in FIG. 2. Because of limitations of draftsmanship, these holding tabs are illustrated in an area where the individual flexible conductive circuit 12 has been previously removed The location of the individual holding tabs is arranged so that there is minimal risk of exposure of the circuits to degradation due to formation of micro-cracks and the like. These holding tabs act as connective links and permit the circuit to remain undisturbed within the web so as to retain and accurately locate individual circuits during certain of the processing operations and prior to final separation of the circuits from the web.

As indicated in FIG. 2, all fiducial marks and other nomenclature (when present) is positioned in non-critical areas located in the out-fall or outer annular area where these items do not interfere with individual circuits nor provide constraints in circuit design. Furthermore, they are neither visible nor present in the end product. By incorporating the individual circuits in the web as illustrated herein, dimensional accuracy and yields are both greatly improved.

The drive holes or bores are standard tooling holes located on 11.25 inch centers on each end of a web from which the panel is formed. These tooling holes along with processing information including fiducial and other marks are, of course, located in the outer annular or circuit out-fall area. Thus, by applying the arrangement as illustrated in FIG. 2, one may accurately register a panel of circuits on a stencil machine or the like without requiring registration for individual piece parts. The arrangement provides for array orientation rather than orientation of individual circuits.

Since the processing presents the circuits to the component placement arrangement on a standard fixture, the apparatus requires only a very small search window to locate the fiducial marks present on the work. After the fiducial marks are located, the positioning of the array is both fixed and determined, and the flexible circuits may be processed as if they were mounted on hardboard.

In the various cleaning operations to which the array of circuits are exposed, each individual circuit in the array illustrated in FIG. 2 is oriented along a common axial direction. This results in a process wherein all circuits are uniformly exposed to the same amount of cleaning and drying time, without requiring individual circuits to be placed in baskets on a conveyor belt where such uniformity may not be achieved. Whenever individual circuits are placed in stacked relationship, capillary action may occur in various fluids tending to hold the two opposed surfaces in mutual contact, one with the other. The processing arrangement as illustrated in FIG. 2 also enhances lot control. Since a web of circuits may be bar-coded or otherwise identified, the condition of circuits in the multiple arrays as well as processing history may be readily and easily monitored.

11. General Advantages

The advantages available from the processing technique of the present invention includes the utilization of a technique for maintaining registration of an array through a series of individual processing operations. Throughout this processing operation, a plurality of circuits are mechanically held together with holding tabs, and are substantially array-oriented with respect to fiducial points. These fiducial points are not present on the finished part, thereby increasing the flexibility for circuit designers. The process of the present invention has shown that the fiducial points are not required on individual circuits, and hence do not have to be present in circuits on a 1:1 basis.

The system further increases operational efficiency through its multiple-up soldering operation, as well as its multiple-up component placement operation. Custom assembly fixturing is accordingly eliminated.

With respect to product performance, it has been found that blanking operations undertaken on finished circuits may cause damage to these circuits through interference with the component mounting interface. Since the circuits are subjected to a blanking operation prior to component mounting, this risk is eliminated.

Testing is undertaken at separate and distinct points in the overall operation, with an initial testing operation being undertaken prior to formation of the working array. This initial testing operation eliminates the need to provide components for circuits which have already been identified as containing a defect, and hence contributes to the economy of the overall circuit preparation process. Also, a testing operation is undertaken when the assembly operation has been completed, thereby permitting the establishment of a 100 percent quality check in the overall operation.

Because of the use of array-oriented processing, custom assembly fixturing is not required. Specifically, fixturing may be provided on a multiple-up or total-circuit-array basis, with the blanking and holding tab forming operation being accomplished with notched dies. The utilization of such fixturing has been found to eliminate edge-registration requirements as well as other individual material-handling requirements which are indicated when circuits are fabricated on an individual basis.

The web from which the arrays are derived may be bar-coded and accordingly easily monitored during all processing operations. Such information and data obtained from such coding has been found repeatability of quality control steps. The finished product has been found to have improved overall properties, particularly with respect to the reduction of the occurrence of micro-cracks.

The present improved method of preparing flexible electronic packages comprising printed conductive circuits having surface-mounted components thereon has been found to improve both yields and electrical properties of the finished product. The scope of the invention is to be determined by substance of the appended claims.

What is claimed is:

1. The method of preparing flexible electronic packages comprising printed conductive circuits having mounting pads arranged thereon to receive surface-mounted components in electrically and mechanically bonded relationship therewith; the method being characterized in that it comprises the steps of:
    (a) forming a plurality of conductive lead patterns within a certain defined circuit pattern portion of a flexible insulating substrate to create a provisional array of flexible conductive circuits;
    (b) forming a plurality of fiducial points on said flexible insulated substrate outside of said defined circuit pattern portion to provide a fixed reference for the circuit patterns comprising said array;
    (c) forming a cut-pattern about the periphery of individual circuits within said provisional array to create holding tabs extending between mutually adjacent individual circuits and said outside annular portion;
    (d) testing each circuit within said provisional array to identify defective units and removing defective units to form a working array;
    (e) mounting and orienting said working array upon a pallet to form an assembly for adjustable placement on a retention bed;
    (f) placing said working array within a first treatment zone for determining presence of circuits within said working array;
    (g) applying a fusible solder paste or conductive thermally setting paste onto the surface of the circuits in said working array at mounting pad locations therealong;
    (h) placing said working array beneath an automatic component placement mechanism and applying active and/or passive components in place on the surface of individual circuits within said working array;
    (i) placing said working assembly with components thereon in a thermal treatment center for reflow of solder paste; and
    (j) testing finished circuits while in said assembly;
    (k) removing the circuit array from said pallet and separating individual finished circuits from said array.

2. The method as defined in claim 1 being particularly characterized in that the application of fusible solder paste onto the surface of circuits in said working array is enabled only in those locations where the presence of a circuit is established.

3. The method as defined in claim 1 being particularly characterized in that said conductive thermally setting paste is a fusible solder paste.

4. The method as defined in claim 1 being particularly characterized in that said automatic component placement mechanism is a rotary component placement turret.

5. The method as defined in claim 3 being particularly characterized in that said working assembly is exposed to a washing operation wherein the surface of the circuits are cleaned to remove excess flux following the placement of the assembly in a thermal treatment center for reflow of solder paste.

* * * * *